United States Patent [19]
Miller

[11] Patent Number: 4,789,917
[45] Date of Patent: Dec. 6, 1988

[54] MOS I/O PROTECTION USING SWITCHED BODY CIRCUIT DESIGN

[75] Inventor: William E. Miller, Los Gatos, Calif.

[73] Assignee: National Semiconductor Corp., Santa Clara, Calif.

[21] Appl. No.: 91,265

[22] Filed: Aug. 31, 1987

[51] Int. Cl.$^4$ .............................................. H02H 3/24
[52] U.S. Cl. .................. 361/56; 357/23.13; 361/92
[58] Field of Search ............ 361/91, 88, 56, 92; 357/13, 23.1, 51, 42, 23.13

[56] References Cited

U.S. PATENT DOCUMENTS

| | | | |
|---|---|---|---|
| 4,066,918 | 1/1978 | Heuner et al. | 361/56 |
| 4,213,140 | 7/1980 | Okabe et al. | 357/23.1 |
| 4,255,671 | 3/1981 | Nonaka et al. | 357/23.1 |
| 4,303,958 | 12/1981 | Allgood | 361/100 |

Primary Examiner—A. D. Pellinen
Assistant Examiner—Todd E. DeBoer
Attorney, Agent, or Firm—Limbach, Limbach & Sutton

[57] ABSTRACT

Switched body circuitry is provided to prevent a system I/O from being effected by the loss of power supply or ground to an MOS integrated circuit within the system. A semiconductor substrate of a first conductivity type has formed therein a well region of a second conductivity type opposite to that of the first conductivity type. First, second, third and fourth spaced-apart shallow diffusion regions of the first conductivity type are formed at the surface of the well region. A first gate electrode and the second and third diffusion regions combine to form an MOS transistor which is either an input pull up or pull down device or an output pull up or pull down driver of the MOS circuit. A second gate electrode and the third and fourth diffusion regions combine to define a first MOS switched body transistor. A third gate electrode and the first and second diffusion regions combine to define a second MOS switched body transistor. These two transistors control the potential of the I/O transistor's body (P-well or N-well) so as to keep the parasitic and ESD protection bipolar transistors and diode turned off during loss of power or ground to the chip.

3 Claims, 5 Drawing Sheets (PRIOR ART)
FIG. 1A. INPUT PROTECTION

MOS I/O PROTECTION USING SWITCHED BODY CIRCUIT DESIGN

BACKGROUND OF THE INVENTION

1. Field of the Invention

The present invention is directed to the protection of a system's data lines connected to a MOS integrated circuit by use of switched body MOS transistors as pullups or pulldowns on the integrated circuit for driving the system's data lines.

2. Discussion of the Prior Art

As shown in FIG. 1A, an input of a conventional junction isolated MOS integrated circuit is clamped to ground or power supply potential by parasitic bipolar devices when the integrated circuit's power supply or ground is lost, respectively. This can have disastrous effects when the input is connected to the system data bus, since the entire system can be shut down because of the power or ground failure to one device. As shown in FIG. 1B, a similar problem arises in the case of an MOS output driver. FIGS. 1C and 1D show a cross-sectional view of a conventional input/output device implemented in P-well and N-well technology, respectively, revealing these parasitic bipolar devices. Note that the transistor bodies are hard wired with P-wells tied to $V_{SS}$ and N-wells tied to $V_{DD}$.

In the conventional designs shown in FIGS. 1A and 1B, if the IC's $V_{DD}$ power supply is lost by being open, the IC's internal $V_{DD}$ bus drops due to the IC's $I_{DD}$ current through the chip's logic to $V_{SS}$. Also $V_{DD}$ can be shorted to ground. In either case, when a component external to the IC attempts to pull the data line to a valid high state, this is prevented by the forward biased diode between the I/O pad and the $V_{DD}$ pad (at 0 volt) on the IC.

Conversely, if the IC's $V_{SS}$ ground is lost by being open, the IC's internal $V_{SS}$ bus rises due to the IC's $I_{DD}$ current through the chip's logic to it's internal $V_{SS}$ bus. When a component external to the IC attempts to pull the data line to a valid low state, this is prevented by the forward biased diode between the $V_{SS}$ pad (at $V_{DD}$ volts) and the I/O pad on the IC.

SUMMARY OF THE INVENTION

The present invention provides switched body circuitry which prevents a system data line from being effected by the loss of power supply or ground to a MOS integrated circuit within the system.

Switched body circuitry in accordance with the present invention is fabricated in a semiconductor substrate of a first conductivity type which has a well region of a second conductivity type opposite to that of the first conductivity type formed in one of its surfaces. First, second, third and fourth spaced-apart shallow diffusion regions of the first conductivity type are formed at the surface of the well region. The first and fourth of these regions are electrically connected to the well region through ohmic contacts. A first gate electrode, which overlies a first channel region between the second diffusion region and the third diffusion region, is connected to provide the proper logic function on the data line. This first gate electrode and the second and third diffusion regions combine to form an MOS transistor which is either an input pull up or pull down device or an output pull up or pull down driver of the MOS circuit. An I/O pad of the MOS circuit is connected to the second diffusion region and to a second gate electrode which overlies a second channel region between the third diffusion region and the fourth diffusion region. Thus, the second gate electrode and the third and fourth diffusion regions combine to define a first MOS switched body transistor. A power supply pad of the MOS circuit is connected to the third diffusion region and to a third gate electrode which overlies a third channel region between the first diffusion region and the second diffusion region. Thus, the third gate electrode and the first and second diffusion regions combine to define a second MOS switched body transistor. These two transistors control the potential of the I/O transistor's body (P-well or N-well) so as to keep the parasitic and ESD protection bipolar transistors and diodes turned off during loss of power or ground to the chip.

These and other objects, advantages and features of the protection circuitry of the present invention will be better understood and appreciated by reference to the detailed description of the invention provided below which should be considered in conjunction with the accompanying drawings.

DESCRIPTION OF THE DRAWINGS

FIG. 1A is a schematic diagram illustrating conventional input protection for an MOS integrated circuit.

DETAILED DESCRIPTION OF THE INVENTION

Figure 1B:
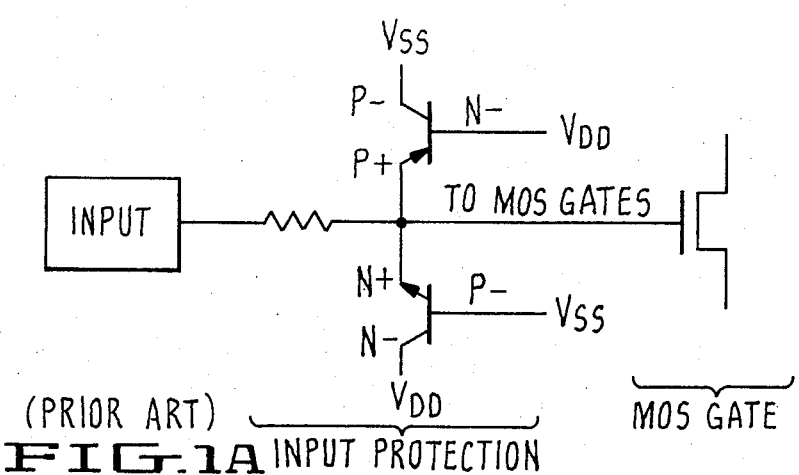
FIG. 1B is a schematic diagram illustrating conventional protection for an integrated circuit MOS output driver.
Figure 1B:
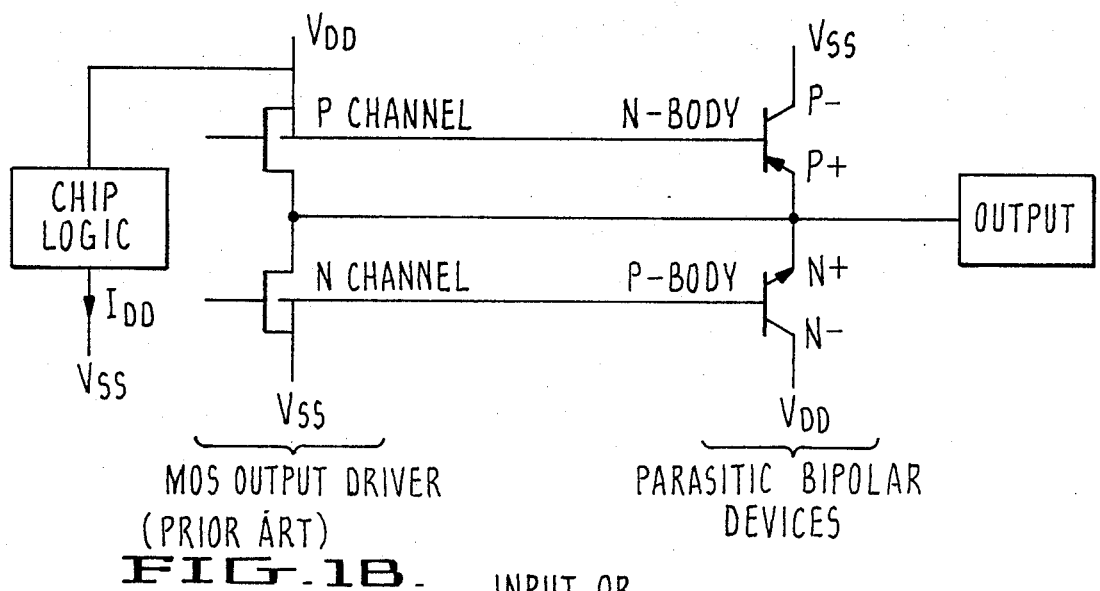
Figure 1C:
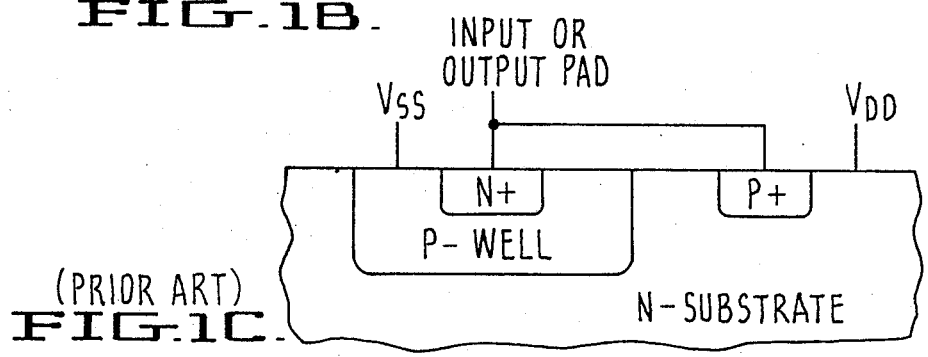
FIG. 1C is a cross-sectional view of a conventional input or output device utilizing P-well technology.
Figure 1D:
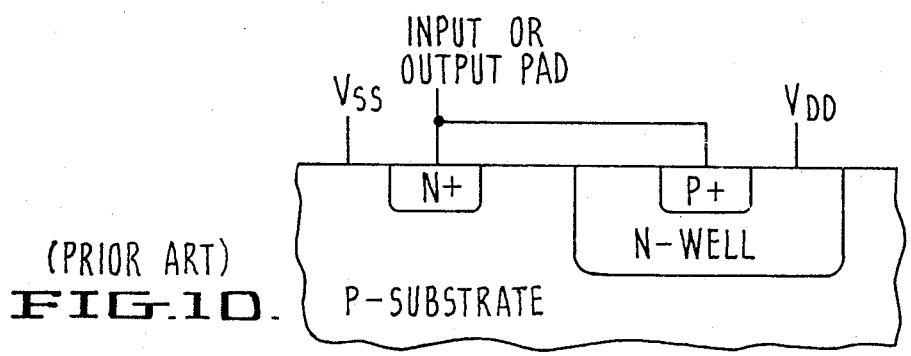
FIG. 1D is a cross-sectional view illustrating a conventional input or output device using N-well technology.
Figure 2A:
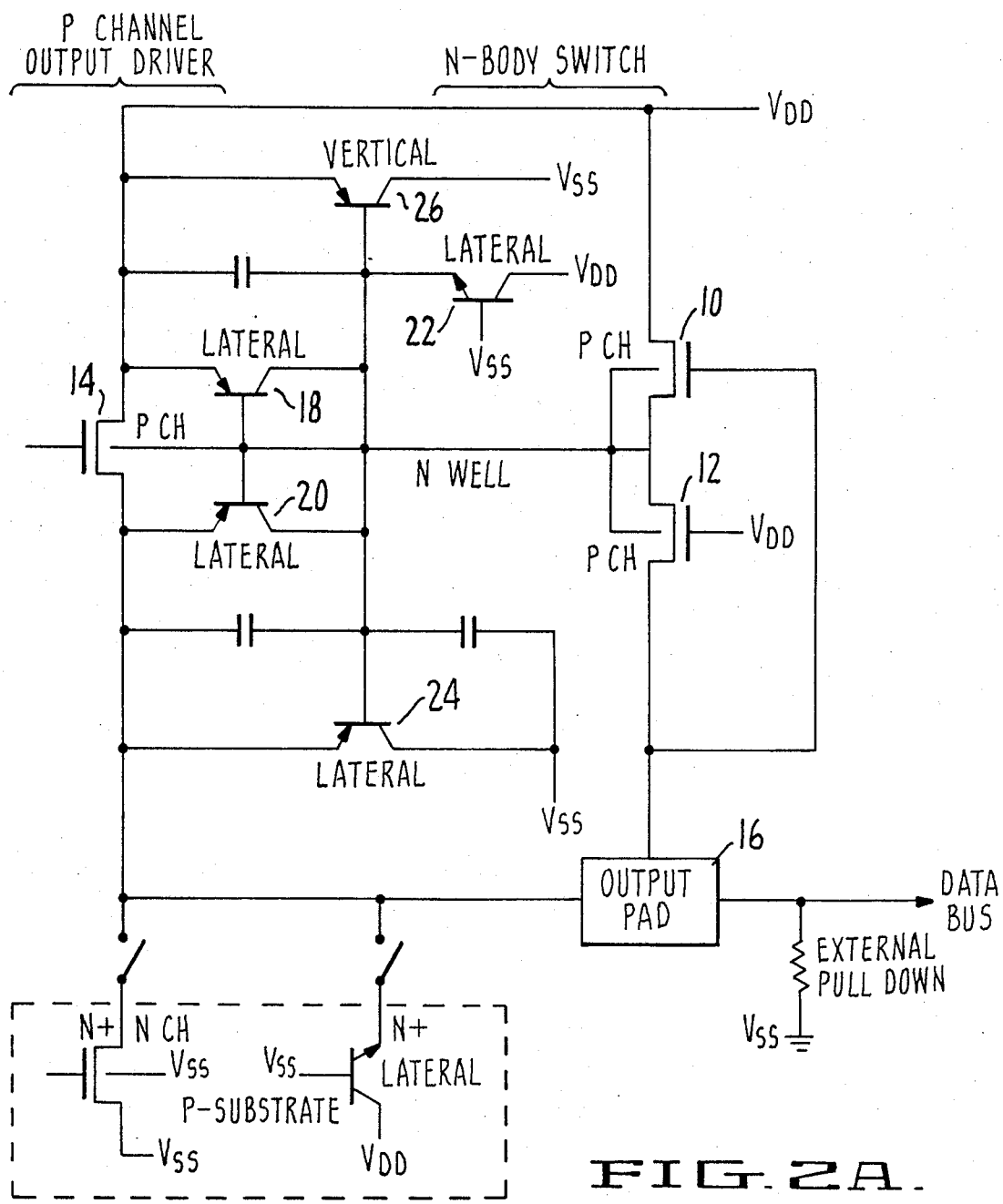
FIG. 2A is a schematic diagram illustrating the use of N-well switched body MOS transistors and an external pull down for protection on P-channel output pull up in accordance with the present invention.
Figure 2B:
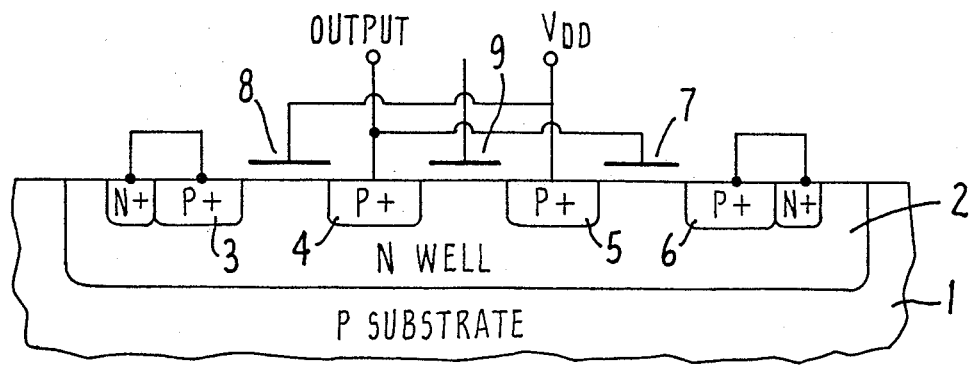
FIG. 2B is a cross-sectional view illustrating the N-well switched body transistors shown in FIG. 2.

FIGS. 2A and 2B illustrate the use of N-well switched body MOS transistors 10 and 12 for protection of a P-channel output driver device 14.

As best shown in FIGS. 2A and 2B, the switched body circuitry is formed in an N-well 2 formed in a P-substrate 1. Four P+ regions 3,4,5,6 are formed in the N-well 2. Output pad 16 is connected to P+ region 4 and to a first gate electrode 7 which overlies a first channel region between P+ region 5 and P+ region 6.

Thus, gate 7 and P+ regions 5 and 6 combine to define a first P-channel switched body transistor 10. The $V_{DD}$ power supply is connected to P+ region 5 and to a second gate electrode 8 which overlies a second channel region between P+ region 3 and P+ region 4. Thus, gate 8 and P+ regions 3 and 4 combine to define a second P-channel switched body transistor 12. P+ region 4 and P+ region 5 combine with a third gate electrode 9, which receives the output from an associated MOS integrated logic circuit, to define an MOS output pull up device 14 for the logic circuit.

As shown in FIG. 2A, in accordance with the present invention, when $V_{DD}$ is 0 or is open ($V_{DD}$=near 0) and the output pad 16 is driven high externally, the N-well 2 of the circuit is driven high through the body switch. This keeps the bipolar devices 18, 20, 22, 24, 26 within the circuit turned off and, thus, the output pad 16 will not be clamped "LOW".

With further reference to FIG. 2A, when ground is lost, the P-substrate 1 and the $V_{SS}$ negative supply rise due to the chip's supply current $I_{DD}$. However, no path exists for the supply current to be sinked to the output pad 16. Thus, the output pad 16 may be pulled "LOW" by external circuitry.

The lateral PNP transistors 18 and 20, illustrated in FIG. 2A, are formed by laying out the two P-channel body switch transistors 10 and 12, as described above in conjunction with FIG. 2B.

As illustrated in the portion of FIG. 2A enclosed by dashed lines, no N+ portion of the circuit can be connected to the output pad 16, since the output would then be pulled high by this circuitry when ground is lost and $V_{SS}$ rises.

During normal operation of the FIG. 2A circuit, the body switch maintains the N-well 2 at the $V_{DD}$ supply, i.e. the highest potential present.

Figure 3A:
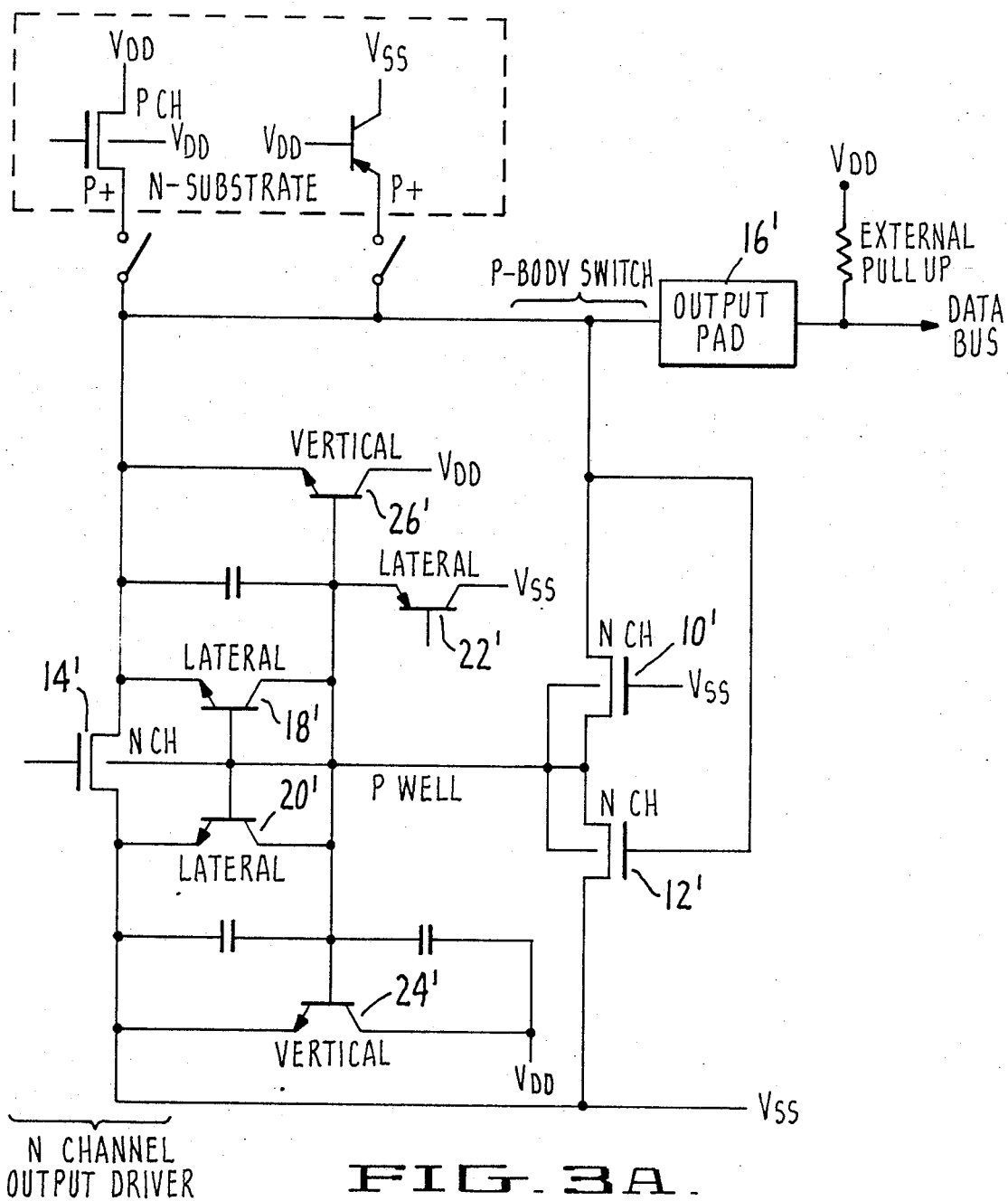
FIG. 3A is a schematic diagram illustrating the use of P-well switched body MOS transistors and an external pull up transistor for protection on an N-channel output pull down in accordance with the present invention.

FIG. 3A illustrates a similar solution for protecting a N-channel output driver 14' utilizing P-well switched body transistors 10' and 12' and an external pull up.

When ground is lost in the FIG. 3A circuit, the $V_{SS}$ negative pad begins to rise due to $I_{DD}$ supply current. When output pad 16' is driven low externally, the P-well of the circuit is driven low through the body switch 10'. This keeps the bipolar devices 18', 20', 22', 24', 26' within the circuit turned off and, thus, the output pad 16' will not be clamped high.

With further reference to FIG. 3A, when $V_{DD}$ is 0 or open ($V_{DD}$=near 0), no path exists for current to be sinked from the output pad 16'. Thus, the output pad 16' may be pulled high by external circuitry.

As illustrated in the portion of FIG. 3A enclosed by dashed lines, no P+ portion of the circuit can be connected to the output pad 16', since the output would then be pulled low by this circuitry when $V_{DD}$ is lost and goes low.

Figure 3B:
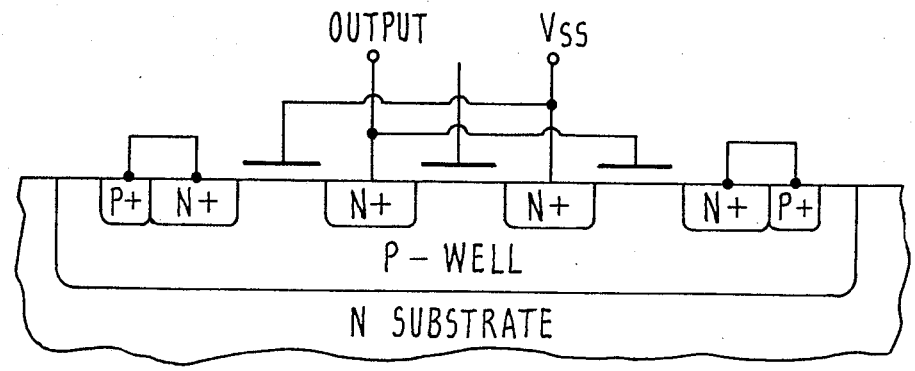
FIG. 3B is a cross-sectional view illustrating the P-well, switched body MOS transistors shown in FIG. 3A.

The lateral NPN transistors 18' and 20', illustrated in FIG. 3A, are formed by laying out the two N-channel body switch transistors 10' and 12' as shown in FIG. 3B.

During normal operation of the FIG. 3A circuit, the body switch maintains the P-well at $V_{SS}$, which is the lowest potential present.

Figure 4:
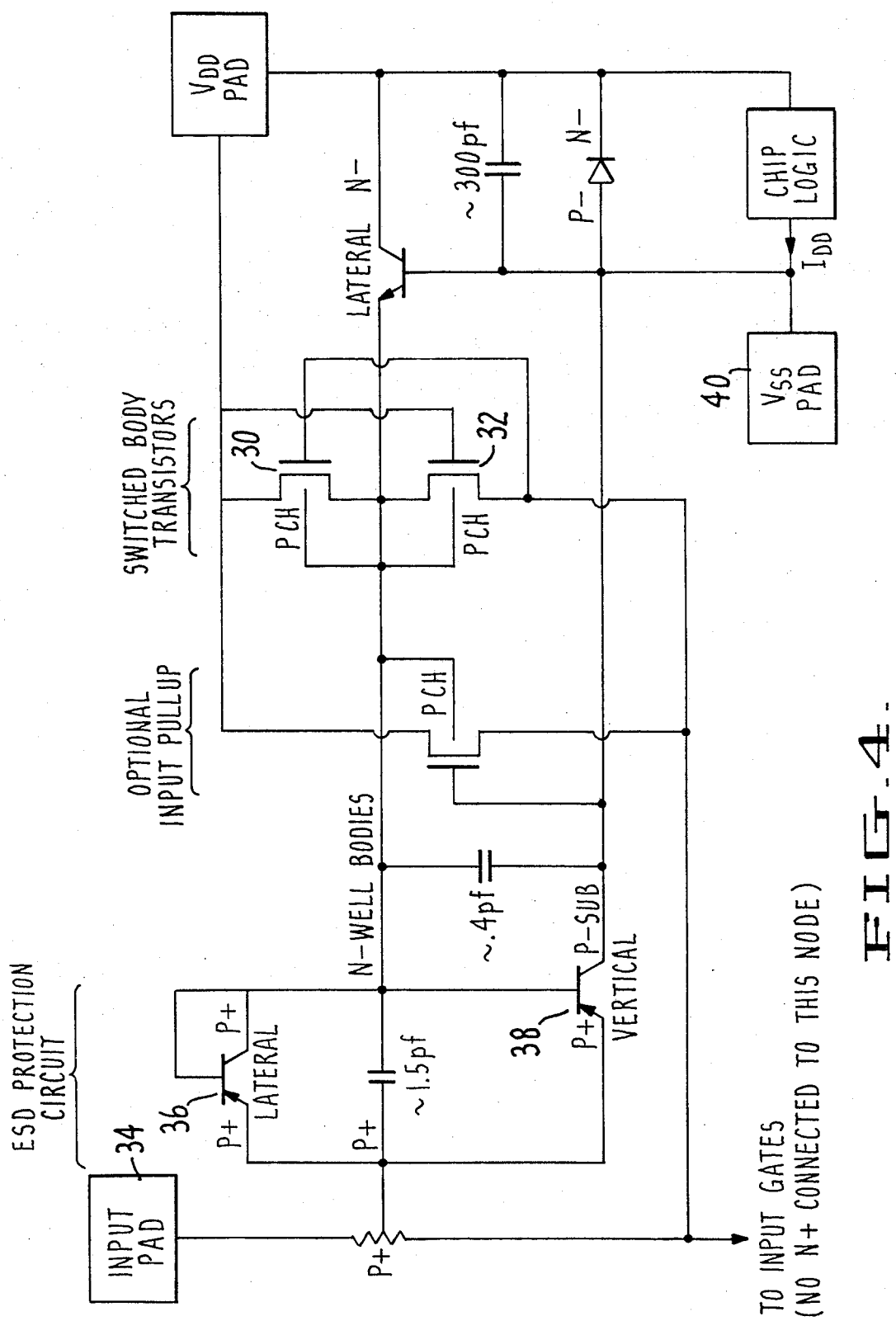
FIG. 4 is a schematic diagram illustrating the use of N-well switched body transistors for protection on an MOS gate input in accordance with the present invention.

As illustrated in FIG. 4, the same switched body transistor concept can be used for protection on an MOS input gate utilizing N-well transistors 30 and 32.

During normal operation, the body switch keeps the N-well body at $V_{DD}$ as in the conventional design. However, if $V_{DD}$ is 0 or open, the body is pulled high whenever the input pad 34 goes high, primarily due to the body switch and, in the case of an input rise time is very fast approximately equal to 100 nsec, the lateral PNP transistor 36 assists pulling the N-well body high. This action keeps the vertical PNP transistor 38 off so that the input pad 34 is not clamped LOW.

If ground is lost, the $V_{SS}$ pad 40 begins to rise due to chip current $I_{DD}$ and the PNPs 36 and 38 are placed in the reverse mode. However, the transistors 36 and 38 have no base drive to turn thm on since the body switch biases the N-well body HIGH.

Under electrostatic discharge, no power is applied to the chip logic 42 except for the ESD pulse with rise time approximately equal to 15 nsec. When a positive ESD pulse is placed on the pad, the vertical PNP 38 turns on since the body switch is not of a low enough resistance for the 15 nsec rise time. When a negative pulse is placed on the pad, the vertical PNP 30 will break down at approximately 40 volts since it is operating in reverse mode with a lower breakdown voltage than in the forward mode. Thus, a 1000 Angstrom gate oxide would not be damaged. A field plate could be utilized to keep the breakdown voltage from being as high, particularly if the gate oxide utilized is 400 Angstroms.

Figure 5:
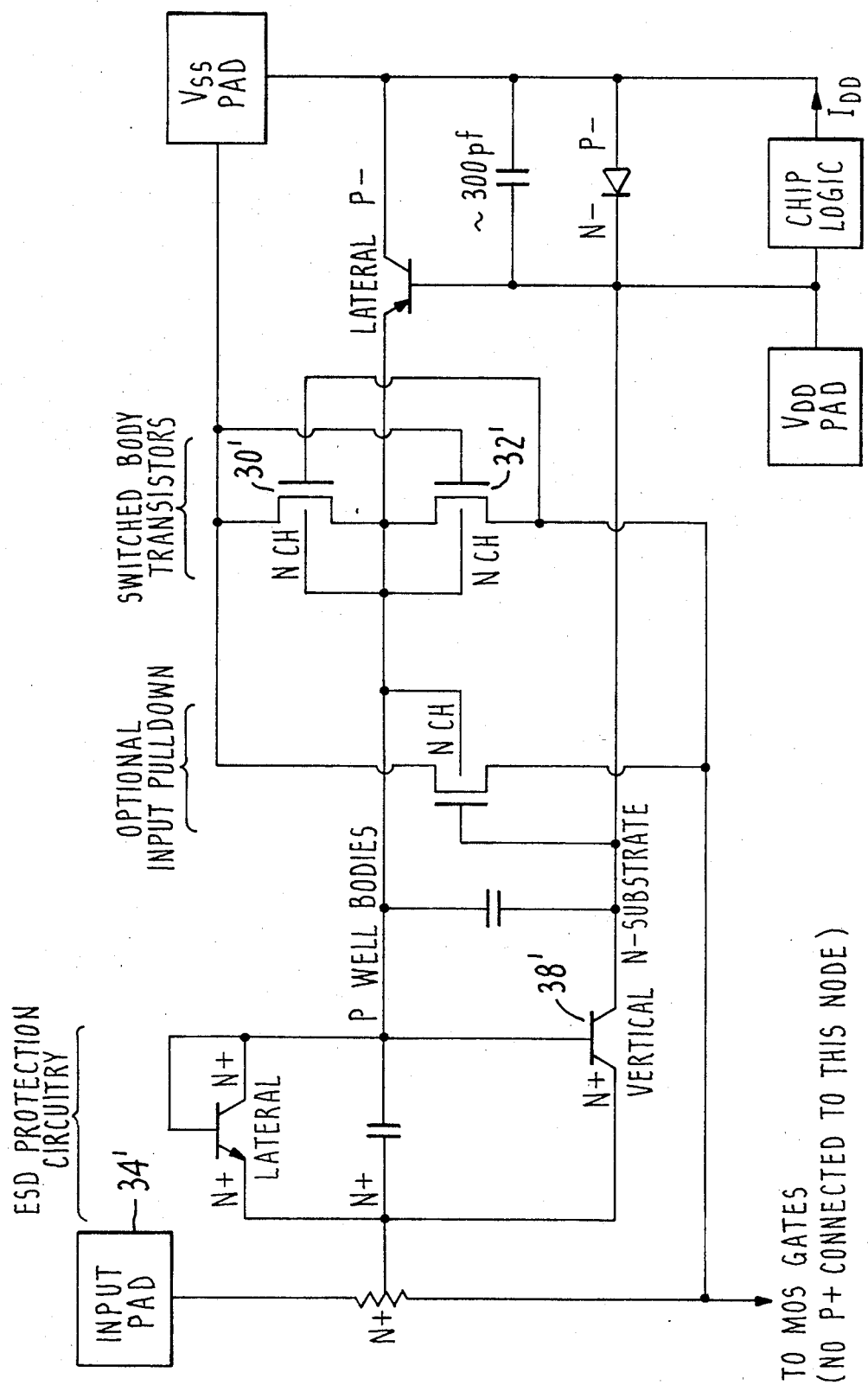
FIG. 5 is a schematic diagram illustrating the use of P-well switched body transistors for protection on an MOS gate input in accordance with the present invention.

FIG. 5 illustrates input protection utilizing P-well switched body transistors 30' and 32'.

In the normal operation of the FIG. 5 circuit, the body switch keeps the P-well body at $V_{SS}$ as in a conventional design. When ground is lost, the $V_{SS}$ pad begins to rise due to chip logic current $I_{DD}$ and the body switch holds the P-well body low whenever the input pad 34' goes low. If the input voltage fall time is very fast, i.e. approximately 100 nsec, the lateral NPN 36 assists pulling the P-well body low. These actions keep the vertical NPN 38' off so that the input can go low and is not held high by the vertical NPN 38' being turned on.

When $V_{DD}$ is 0 or open, all internal nodes of the circuit go to 0 volts, including the P-well body, and the NPN devices 36' and 38' will be off whether the input is high or low.

Under ESD pulses, the NPN transistors 36' and 38' turn on in the forward mode for positive input pulses and break down in reverse mode for negative input pulses. Field plates are utilized to obtain a breakdown voltage below the gate oxide breakdown voltage and above the input and power supply operating voltage.

It should be understood that various alternatives to the embodiment of the invention described herein may be implied in practicing the invention. It is intended that the following claims define the scope of the invention and that structures within the scope of these claims and their equivalents be covered thereby.

What is claimed is:

1. A MOS integrated circuit including switched body circuitry that protects a system data line connected to an input/output pad, the circuit comprising:
   (a) a semiconductor substrate of a first conductivity type;
   (b) a well region of a second conductivity type opposite to that of the first conductivity type formed in a surface of the substrate;
   (c) first, second, third and fourth spaced-apart shallow diffusion regions of the first conductivity type formed in a surface of the well region, the first and fourth of these regions being electrically connected to the well region through ohmic contacts;

(d) a first gate electrode overlying a first channel region between the second diffusion region and the third diffusion region, the first gate electrode and the second and third diffusion regions combining to define a MOS transistor, the first gate electrode being connected to receive a logic signal;

(e) an input/output pad connected to the second diffusion region and to a second gate electrode overlying a second channel region between the third diffusion region and the fourth diffusion region, the second gate electrode and the third and fourth diffusion regions combining to define a first switched body MOS transistor; and (f) a power supply pad connected to the third diffusion region and to a third gate electrode overlying a third channel region between the first diffusion region and the second diffusion region, the third gate electrode and the first and second diffusion regions combining to define a second switched body MOS transistor.

2. A MOS integrated circuit including switched body circuitry that protects a system data line connected to an input pull up or pull down device, the circuit comprising:

(a) a semiconductor substrate of a first conductivity type;

(b) a well region of a second conductivity type opposite to that of the first conductivity type formed in a surface of the substrate;

(c) first, second, third and fourth spaced-apart shallow diffusion regions of the first conductivity type formed in a surface of the well region, the first and fourth of these regions being electrically connected to the well region through ohmic contacts;

(d) a first gate electrode overlying a first channel region between the second diffusion region and the third diffusion region, the first gate electrode and the second and third diffusion regions combining to define an MOS pull up or pull down transistor, the first gate electrode being connected to a $V_{SS}$ for a MOS pull up or to a $V_{DD}$ for a pull down;

(e) an input pad connected to the second diffusion region and to a second gate electrode overlying a second channel region between the third diffusion region and the fourth diffusion region, the second gate electrode and the third and fourth diffusion regions combining to define a first switched body MOS transistor; and (f) a power supply pad connected to the third diffusion region and to a third gate electrode overlying a third channel region between the first diffusion region and the second diffusion region, the third gate electrode and the first and second diffusion regions combining to define a second switched body MOS transistor.

3. A MOS integrated circuit including switched body circuitry that protects a system data line connected to an output driver, the circuit comprising:

(a) a semiconductor substrate of a first conductivity type;

(b) a well region of a second conductivity type opposite to that of the first conductivity type formed in a surface of the substrate;

(c) first, second, third and fourth spaced-apart shallow diffusion regions of the first conductivity type formed in a surface of the well region, the first and fourth of these regions being electrically connected to the well region through ohmic contacts;

(d) a first gate electrode overlying a first channel region between the second diffusion region and the third diffusion region, the first gate electrode and the second and third diffusion regions combining to define an MOS output driver transistor, the first gate electrode being connected to receive a logic output signal;

(e) an output pad connected to the second diffusion region and to a second gate electrode overlying a second channel region between the third diffusion region and the fourth diffusion region, the second gate electrode and the third and fourth diffusion regions combining to define a first switched body MOS transistor; and (f) a power supply pad connected to the third diffusion region and to a third gate electrode overlying a third channel region between the first diffusion region and the second diffusion region, the third gate electrode and the first and second diffusion regions combining to define a second switched body MOS transistor.

* * * * *